(12) United States Patent
Nakamura et al.

(10) Patent No.: US 11,910,534 B2
(45) Date of Patent: Feb. 20, 2024

(54) MOUNTING APPARATUS (71) Applicant: SHINKAWA LTD., Tokyo (JP)

(72) Inventors: Tomonori Nakamura, Tokyo (JP);
Koji Matsushita, Tokyo (JP); Hiroshi Omata, Tokyo (JP); Masahito Tsuji, Tokyo (JP); Keiichi Hiruma, Tokyo (JP); Mitsuteru Sakamoto, Tokyo (JP); Ryo Urahashi, Tokyo (JP); Takaya Kinjo, Tokyo (JP); Shota Nakano, Tokyo (JP); Akira Sekikawa, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 429 days.

(21) Appl. No.: 17/312,388

(22) PCT Filed: Dec. 9, 2019

(86) PCT No.: PCT/JP2019/048163
§ 371 (c)(1),
(2) Date: Jun. 9, 2021

(87) PCT Pub. No.: WO2020/122033
PCT Pub. Date: Jun. 18, 2020

(65) Prior Publication Data
US 2022/0046838 A1    Feb. 10, 2022

(30) Foreign Application Priority Data

Dec. 10, 2018    (JP) .................................. 2018-231104

(51) Int. Cl.
*H05K 13/08* (2006.01)

(52) U.S. Cl.
CPC ......... *H05K 13/083* (2018.08); *H05K 13/081* (2018.08)

(58) Field of Classification Search
CPC ........................... H05K 13/083; H05K 13/081
(Continued)

(56) References Cited

U.S. PATENT DOCUMENTS 10,165,719 B2 * 12/2018 Itoh ...................... H05K 13/083
2018/0080763 A1    3/2018 Kasahara et al.

FOREIGN PATENT DOCUMENTS

CN    105164522    12/2015
JP    2000039599    2/2000
(Continued)

OTHER PUBLICATIONS

"International Search Report (Form PCT/ISA/210) of PCT/JP2019/048163," dated Jan. 28, 2020, with English translation thereof, pp. 1-4.
(Continued)

*Primary Examiner* — James D Sells
(74) *Attorney, Agent, or Firm* — JCIPRNET (57) ABSTRACT

A mounting device includes: an application part applying paste on a substrate to form an application body; a bonding part forming a mounted body by mounting a chip component on the substrate via the application body; a first imaging part imaging the application body after application processing and before mounting processing to acquire first image information; a second imaging part imaging the mounted body after the mounting processing to acquire second image information; and a control part controlling the application part, the bonding part, and the first and second imaging parts, and obtains a 3D application body shape (first shape) from the first image information as a first shape and calculates a 3D mounted body shape (second shape) from the second image information. The control part evaluates the application processing or the mounting processing based on the first and the second shapes.

17 Claims, 10 Drawing Sheets

(58) Field of Classification Search
USPC .......................................................... 156/367
See application file for complete search history.

(56) References Cited

FOREIGN PATENT DOCUMENTS

| | | |
|---|---|---|
| JP | 2003004660 | 1/2003 |
| JP | 3832622 | 10/2006 |
| JP | 2015025656 | 2/2015 |
| JP | 2016070810 | 5/2016 |
| JP | 2018048824 | 3/2018 |
| WO | 2014118982 | 8/2014 |

OTHER PUBLICATIONS

"Office Action of Taiwan Counterpart Application", dated Nov. 25, 2020, with partial English translation thereof, p. 1-p. 15.

* cited by examiner

MOUNTING APPARATUS

CROSS-REFERENCE TO RELATED APPLICATION

This application is a 371 application of the International PCT application serial no. PCT/JP2019/048163, filed on Dec. 9, 2019, which claims the priority benefit of Japanese Patent Application No. 2018-231104, filed on Dec. 10, 2018. The entirety of each of the above-mentioned patent applications is hereby incorporated by reference herein and made a part of this specification.

BACKGROUND

Technical Field

The present specification discloses a mounting apparatus for mounting a chip component after applying a paste on a substrate.

Related Art

Conventionally, a mounting apparatus for mounting a chip component such as a semiconductor chip or the like on a substrate has been widely known. Some of these mounting apparatuses have an application part for applying a paste such as NPC or the like on a substrate and a bonding part for bonding a chip component on the paste applied on the substrate. In general, the application part and the bonding part have a camera, and based on images obtained by using the camera, a dispenser and a bonding head are positioned, the quality of a mounting result is judged, or the like.

However, conventionally, information obtained from images is limited to two-dimensional information, and a three-dimensional shape of an object such as a paste or a chip component cannot be grasped. As a result, there is a problem that the height or the like of the chip component mounted on the paste or the substrate cannot be known, and the quality of the mounting result cannot be accurately grasped.

Thus, conventionally, many techniques for grasping the three-dimensional shape of the paste or the chip component have been proposed. For example, patent literature 1 discloses a technique for inspecting a solder-joined state by using an X-ray inspection device in a device in which electronic components are solder-joined to a mounted substrate. Further, patent literature 2 discloses a technique for measuring the volume of a die bond paste applied on a lead frame by a laser displacement measuring instrument before a semiconductor chip is fixed to the lead frame.

LITERATURE OF RELATED ART

Patent Literature

Patent literature 1: Japanese Patent Application Laid-Open No. 2018-48824
Patent literature 2: Japanese Patent No. 3832622

SUMMARY

Problems to be Solved

According to the above technique, the shape of the paste or the chip component can be grasped three-dimensionally, and the states thereof can be grasped more accurately. However, as in patent literature 1, when the chip component (electronic component) is mounted and then measured three-dimensionally, even if a product defect is found, it is difficult to determine whether the defect is caused by application processing of the paste or mounting processing of the chip component. Besides, because the cause cannot be identified, it is difficult to take appropriate measures to prevent defects. Further, in the case of the technique of patent literature 2, although the quality of the application processing of the paste can be determined, the quality of final products cannot be determined.

Thus, the present specification discloses a mounting apparatus capable of identifying the cause of a mounting defect.

Means to Solve Problems

A mounting apparatus disclosed in the present specification, for mounting a chip component on a substrate via a paste, includes: a paste application part that applies a paste on a substrate under predetermined application conditions to form an application body; a bonding part that forms a mounted body obtained by mounting a chip component on the substrate under predetermined mounting conditions via the application body; a first imaging part that images the application body after application processing of the paste and before mounting processing of the chip component to acquire first image information; a second imaging part that images the mounted body after the mounting processing to acquire second image information; and a control part that controls the paste application part, the bonding part, and the first and second imaging part and obtains a three-dimensional shape of the application body from the first image information as a first shape and calculates a three-dimensional shape of the mounted body from the second image information as a second shape. The control part evaluates the application processing or the mounting processing based on the first shape and the second shape.

Effect

According to the mounting apparatus disclosed in the present specification, the cause of a mounting defect can be identified.

DESCRIPTION OF THE EMBODIMENTS

Figure 1:
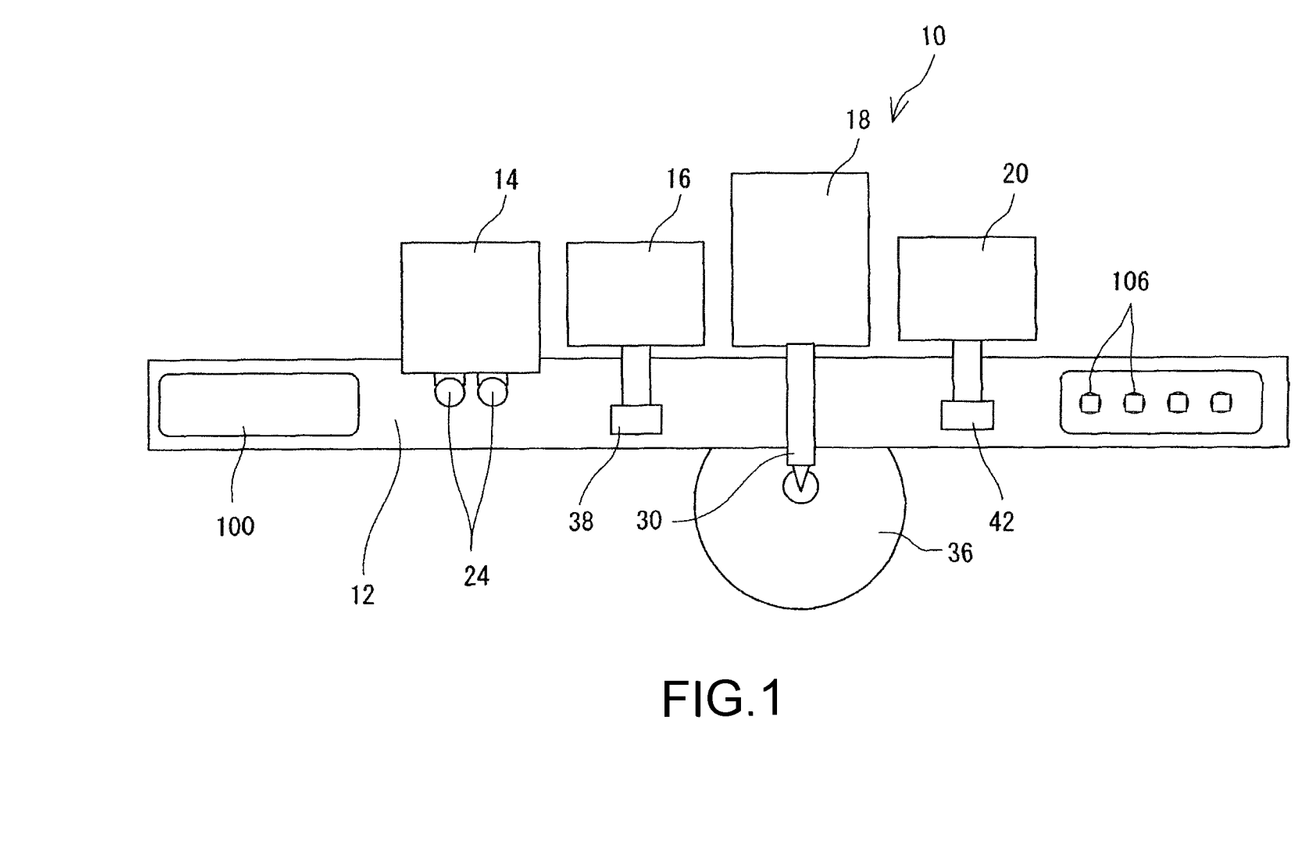
FIG. 1 is a schematic plan view of a mounting apparatus.
Figure 2:
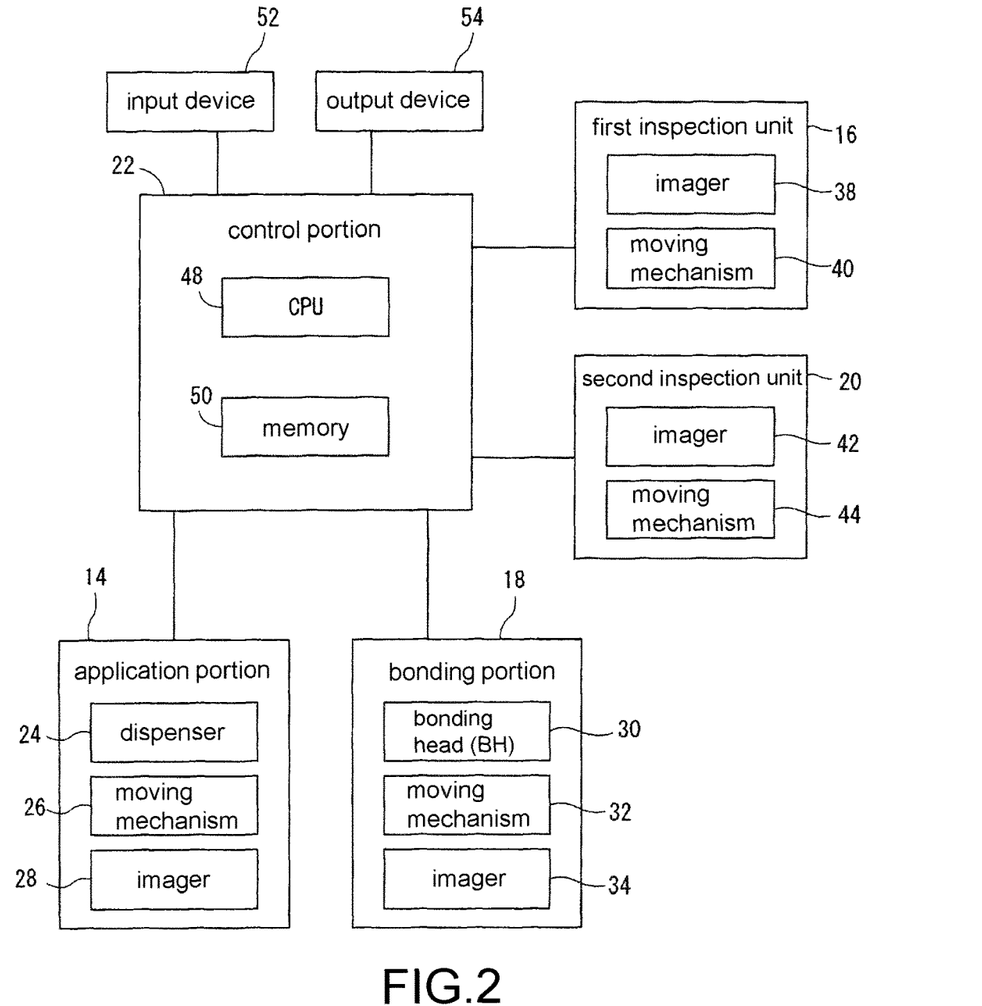
FIG. 2 is a block diagram showing the configuration of the mounting apparatus.

Hereinafter, the configuration of a mounting apparatus 10 is described with reference to drawings. FIG. 1 is a schematic plan view of the mounting apparatus 10. Further, FIG. 2 is a block diagram showing the configuration of the mounting apparatus 10. The mounting apparatus 10 mounts one or more chip components 104 on a substrate 100 to manufacture a mounted body 106. Hereinafter, a die bonding apparatus that fixes the chip component 104 referred to as a "die" to the substrate 100 via a paste-like adhesive made of resin or metal is described as an example.

In the mounting apparatus 10, a transfer rail 12 that transfers the substrate 100 in one direction (X direction) is arranged. The substrate 100 in this example is a lead frame having one or more mounted sections of the chip component 104. An application part 14, a first inspection unit 16, a bonding part 18, and a second inspection unit 20 are arranged in order from the upstream side along the transfer rail 12.

The application part 14 applies a paste on the surface of the substrate 100, and has a dispenser 24, a moving mechanism, and the like. The paste is an adhesive that joins the chip component 104 to the mounted section of the substrate 100, and is made of, for example, resin, solder, or the like. Hereinafter, an object obtained by applying the paste on the substrate 100 is referred to as an "application body 102". The dispenser 24 discharges the paste onto the substrate 100 to form the application body 102 and is, for example, a syringe type dispenser. The moving mechanism 26 (see FIG. 2) has a motor, an air cylinder, a hydraulic cylinder, or the like as a drive source, and moves the dispenser 24 in a Y direction (that is, a direction orthogonal to a transfer path of the substrate 100) and a Z direction. In addition, as shown in FIG. 1, the dispenser 24 is not limited to one, and may be plural.

Further, the application part 14 also has an imager 28 that images the mounted section for application from a vertical direction to acquire a plan-view image (see FIG. 2). The imager 28 images the mounted section both before and after the paste is applied. Before paste application, the position of the dispenser 24 with respect to the mounted section is calculated based on image data obtained by the imager 28, and the dispenser 24 is positioned based on the calculation result. Further, after paste application, the imager 28 functions as a first imaging part that images the application body 102 formed in the mounted section from the vertical direction to acquire a first plan-view image. The acquired first plan-view image is stored in a memory 50 of a control part 22 in association with identification information for each mounted section (for example, an ID number and the like set for each mounted section).

The first inspection unit 16 is arranged between the application part 14 and the bonding part 18, and has an imager 38 and a moving mechanism 40. The imager 38 images the application body 102 from an oblique direction to acquire a first oblique-view image. The first oblique-view image is associated with the identification information for each mounted section and is stored in the memory 50 of the control part 22.

Here, if the imager 38 can acquire image information including height information, the configuration thereof is not limited to a configuration for acquiring an oblique-view image. Therefore, the configuration for acquiring image information including height information may be, for example, a stereo camera system including two cameras having parallax. Further, as another form, the imager 38 may be a system using a non-contact length measuring instrument that scans and acquires the surface height of an object. Further, the imager 38 may be an imager using a so-called optical cutting method in which the surface of an object is irradiated with light having a geometric shape and then the object is imaged by an image sensor. Further, the imager 38 may not be limited to an imager that acquires only the surface shape of an object, and may be an imager that also acquires the cross-sectional shape of an object. For example, the imager 38 may be an imager that acquires a tomographic image of an object by using X-rays or the like. Hereinafter, an example is described in which the imager 38 acquires an oblique-view image.

The bonding part 18 mounts the chip component 104 such as a semiconductor chip and the like on the application body 102 applied on the mounted section. In the bonding part 18, a bonding head 30 that sucks and holds the chip component 104 and transfers the chip component 104, a moving mechanism 32 that moves the bonding head 30 in the Y direction and the Z direction, and an imager 34 are arranged. Further, a wafer stage 36 is arranged on the opposite side of the bonding part 18 with the transfer rail 12 sandwiched between the wafer stage 36 and the bonding part 18. The chip components 104 (dies) obtained by dicing a wafer are placed on the wafer stage 36. The bonding head 30 picks up the chip component 104 from the wafer stage 36 and bonds the chip component 104 to a target mounted section. Hereinafter, an object obtained by fixing the chip component 104 via the application body 102 is referred to as a "mounted body 106".

The imager 34 has substantially the same configuration as the imager 28 arranged in the application part 14, and images the mounted section for mounting and the chip component 104 to be picked up from the vertical direction. Based on the images captured by the imager 34, the control part 22 calculates a relative position between the bonding head 30 and the wafer stage 36 or the substrate 100, and positions the bonding head 30 in accordance with the calculation result. Further, the imager 34 also images the mounted section and the mounted body 106 after bonding. As a second plan-view image, the image of the mounted body 106 is stored in the memory 50 of the control part 22 in association with identification information of the mounted section.

The second inspection unit 20 is arranged further downstream of the bonding part 18. The second inspection unit 20 has substantially the same configuration as the first inspection unit 16, and has an imager 42 and a moving mechanism 44 that moves the imager 42 in the X direction. The imager 42 of the second inspection unit 20 images the mounted section after bonding, that is, the mounted body 106 from an oblique direction to acquire a second oblique-view image. The second oblique-view image is stored in the memory 50 of the control part 22 in association with identification information for each mounted section. Similar to the imager 38, if the imager 42 can acquire image information including height information, the configuration thereof is not particularly limited. Further, the imager 42 may have the same configuration as the imager 38 of the first inspection unit 16, or may have a different configuration.

The control part 22 controls the drive of the application part 14, the bonding part 18, the first inspection unit 16, and the second inspection unit 20 described above. This control part 22 has a CPU 48 that performs various calculations and the memory 50 that stores various programs and data. In addition, although the control part 22 is shown as a single device in FIG. 2, the control part 22 may be configured by combining a plurality of computers, and may have a plurality of CPUs 48 and a plurality of memories 50. For example, the control part 22 may be configured by a control computer incorporated into the mounting apparatus 10 and a personal computer capable of communicating with the control computer. In any case, the control part 22 controls the drive of each part constituting the mounting apparatus 10, and calculates three-dimensional shapes of the application body 102 and the mounted body 106 based on the oblique-view image, the plan-view image, and the like described above. Then, the control part 22 independently evaluates application processing and mounting processing based on the three-dimensional shapes, and the description is as follows.

An input device 52 and an output device 54 are connected to the control part 22. The input device 52 is for inputting various data or commands to the control part 22 and corresponds to, for example, a keyboard, a mouse, a dedicated switch, a microphone, and the like. Further, the output device 54 presents various pieces of information to a user and corresponds to, for example, a display, a speaker, and the like.

Figure 3:
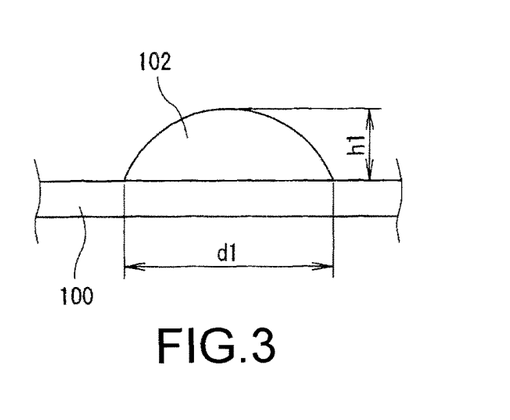
FIG. 3 is an image diagram of a mounted section after application processing.
Figure 4:
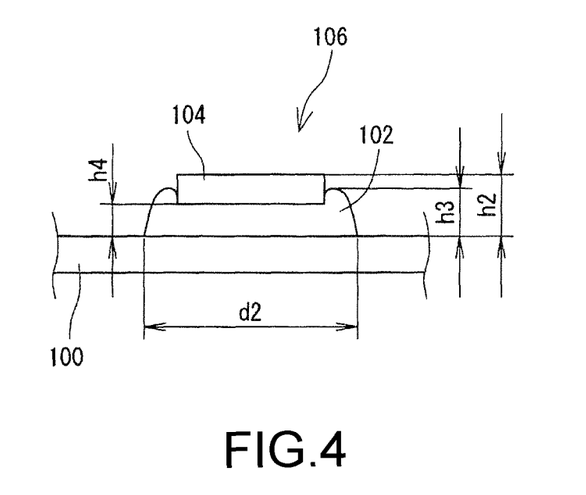
FIG. 4 is an image diagram of a mounted section after mounting processing.

Next, each size appearing in the following description is described with reference to FIG. 3 and FIG. 4. FIG. 3 is a diagram showing the state of the mounted section after paste application, and FIG. 4 is a diagram showing the state of the mounted section after bonding. The application body 102 formed by applying the paste is formed on the substrate 100 after paste application and before bonding. As shown in FIG. 3, the application body 102 swells into a substantially dome shape due to surface tension. Hereinafter, the diameter of the application body 102 is referred to as a "paste diameter d1", and the maximum height of the application body 102 is referred to as a "paste height h1". Further, after bonding, the chip component 104 is fixed on the substrate 100 by the application body 102 and constitutes the mounted body 106. Hereinafter, the diameter of the application body 102 constituting the mounted body 106 is referred to as a "mounting diameter d2". Further, the distance from the surface of the substrate 100 to the upper surface of the chip component 104 is referred to as a "die height h2", the distance from the surface of the substrate 100 to the highest point of the paste is referred to as a "fillet height h3", and the distance from the surface of the substrate 100 to the bottom surface of the chip component 104 is referred to as a "bottom height h4".

Figure 5:
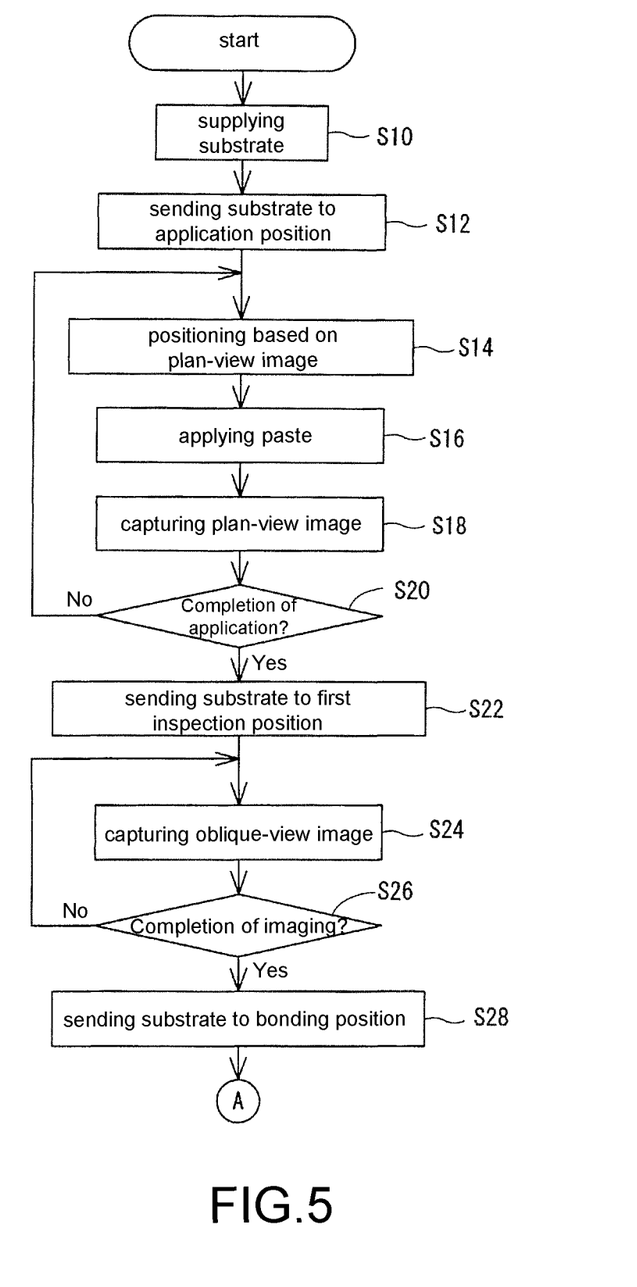
FIG. 5 is a flowchart showing the flow of the mounting processing.
Figure 6:
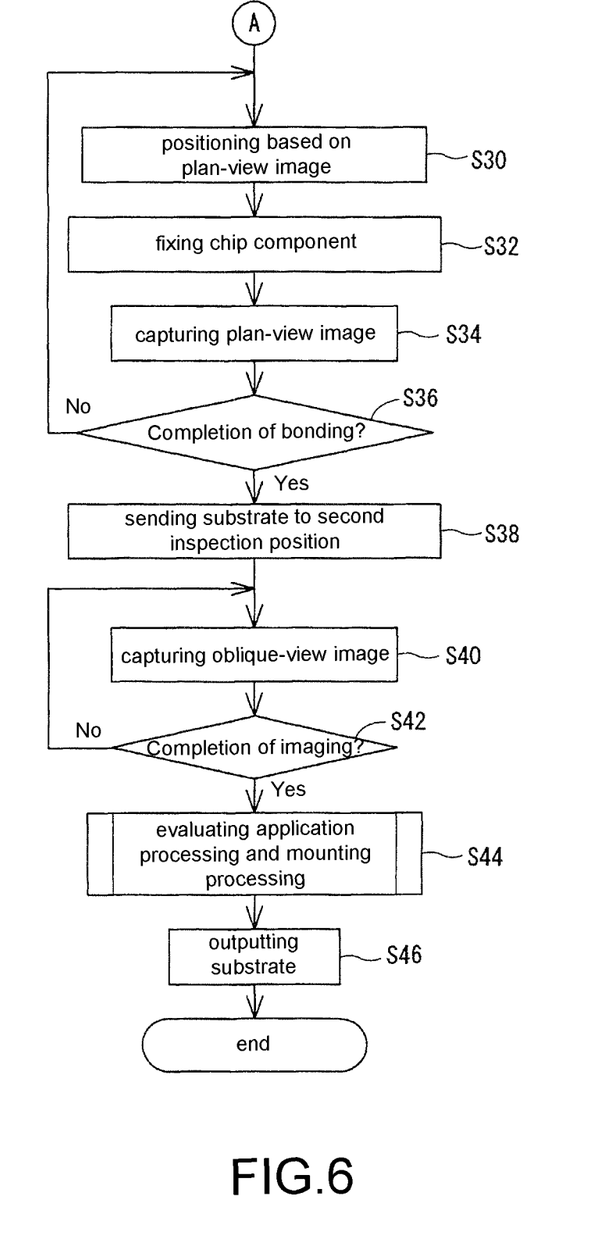
FIG. 6 is a flowchart showing the flow of the mounting processing.

Next, the flow of the mounting processing using this mounting apparatus 10 is described with reference to FIG. 5 and FIG. 6. FIG. 5 and FIG. 6 are flow charts showing the flow of the mounting processing. In the mounting processing, first, the substrate 100 is supplied to the transfer rail 12 (S10). The control part 22 drives the transfer rail 12 to transfer the substrate 100 to an application position set on the transfer rail 12 (S12). At the application position, a plan-view image of the substrate 100 is acquired by the imager 28 arranged in the application part 14. Based on the plan-view image, the control part 22 calculates the relative position of the substrate 100 with respect to the dispenser 24, and positions the substrate 100 and the dispenser 24 (S14). If the positioning is possible, the control part 22 drives the dispenser 24 to apply the paste on the mounted section on the surface of the substrate 100 and form the application body 102 (S16). If it is possible to apply the paste on one mounted section, the control part 22 drives the imager 28 to image the application body 102 (S18). The plan-view image obtained by the imaging is stored in the memory 50 of the control part 22 as the first plan-view image. This application processing is repeatedly executed for all mounted sections of the substrate 100.

Then, if it is possible to apply the paste on all mounted sections (Yes in S20), subsequently, the control part 22 transfers the substrate 100 to a first inspection position set on the transfer rail 12 (S22). At the first inspection position, the application body 102 is imaged from an oblique direction by the imager 38 (S24). The oblique-view image obtained by the imaging is stored in the memory 50 of the control part 22 as the first oblique-view image.

If oblique-view images are obtained for all mounted sections (the application bodies 102) (Yes in S26), the control part 22 subsequently transfers the substrate 100 to a bonding position set on the transfer rail 12 (S28). At the bonding position, a plan-view image of the chip component 104 sucked and held by the substrate 100 and the bonding head 30 is acquired by the imager 34 arranged in the bonding part 18. Based on the plan-view image, the control part 22 calculates the relative position of the chip component 104 with respect to the substrate 100, and positions the chip component 104 (S30). If the positioning is possible, the control part 22 drives the bonding head 30 to press the chip component 104 onto the application body 102 and fix the chip component 104 (S32). If it is possible to fix the chip component 104 to one mounted section, the control part 22 drives the imager 34 to image the mounted body 106 (S34). The plan-view image obtained by the imaging is stored in the memory 50 of the control part 22 as the second plan-view image. This mounting processing is executed for all mounted sections of the substrate 100.

Then, if it is possible to bond the chip component 104 to all mounted sections (Yes in S36), subsequently, the control part 22 transfers the substrate 100 to a second inspection position set on the transfer rail 12 (S38). At the second inspection position, each mounted body 106 is imaged from an oblique direction by the imager 42 (S40). The oblique-view image obtained by the imaging is stored in the memory 50 of the control part 22 as the second oblique-view image.

If oblique-view images are obtained for all mounted sections (Yes in S42), the control part 22 evaluates the mounting processing based on at least the first oblique-view image and the second oblique-view image (S44). Then, if the evaluation is completed for all mounted sections, the substrate 100 is output (S46).

In the evaluation of the mounting processing, the application processing and the mounting processing are evaluated individually. That is, in most of conventional evaluations of the mounting processing, the shape of the mounted body 106 is compared with a target shape, and the quality of the mounting processing is judged based on the difference. However, in this case, the difference from the target shape includes a difference caused by an application defect and a difference caused by a mounting defect. Therefore, in conventional techniques that focus only on the difference between the shape of the mounted body 106 and the target shape, it is difficult to determine whether the mounting detect is caused by the application processing or the mounting processing. Besides, because the cause of the defect cannot be identified, appropriate measures cannot be taken to reduce the defect.

In this example, as is clear from the above description, not only the oblique-view image of the mounted body 106 (the second oblique-view image), but also the oblique-view image of the application body 102 before the mounting processing (the first oblique-view image) is acquired. By acquiring the above two oblique-view images, a first shape which is the three-dimensional shape of the application body 102 and the three-dimensional shape of the mounted body 106 can be calculated. Then, the two shapes can be calculated, and thereby the application processing and the mounting processing can be evaluated individually, and the cause of the mounting defect can be identified.

Figure 7:
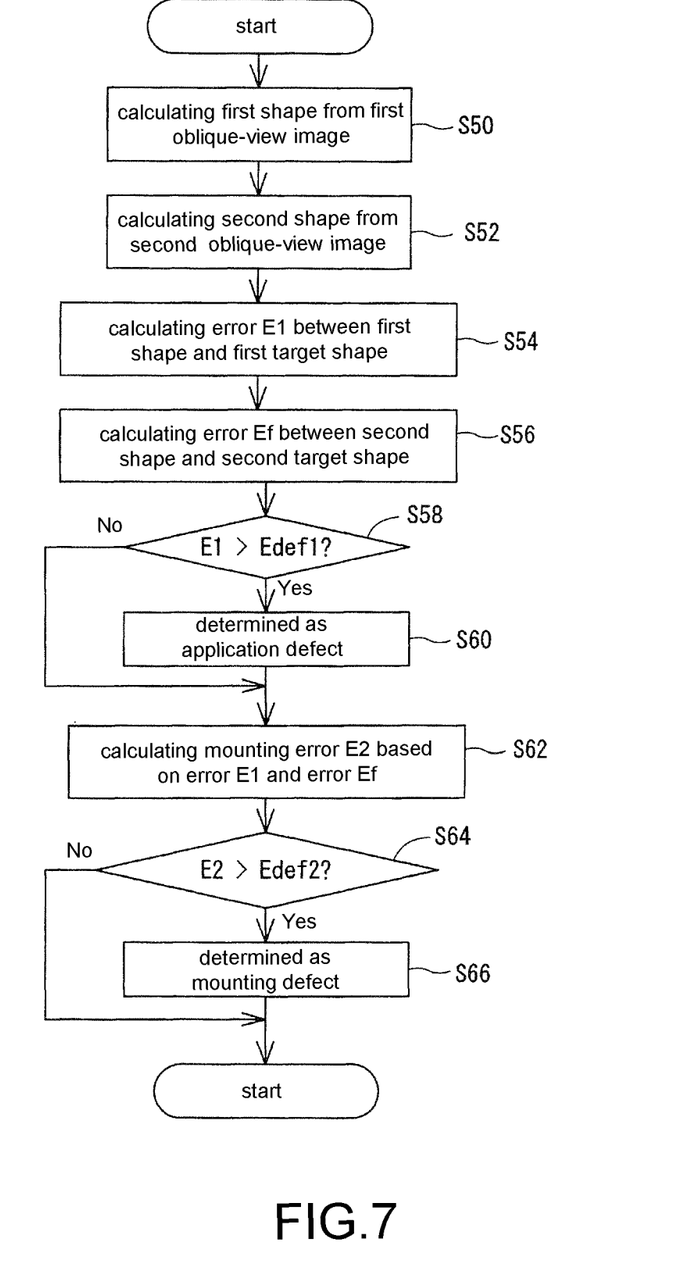
FIG. 7 is a flowchart showing the flow of evaluation of each processing.

As described above, various methods for individually evaluating the application processing and the mounting processing are considered. For example, the application processing may be evaluated based on the first shape, and the mounting processing may be evaluated based on an evaluation result of the application processing and a second shape. FIG. 7 is a flowchart showing an example of evaluation processing. When each processing is evaluated, the control part 22 first calculates, from the first oblique-view image, the first shape which is the three-dimensional shape of the application body 102 formed on the substrate 100 (S50). It is desirable that the first shape includes at least the paste height h1, the paste diameter d1, and a paste volume Vp. Further, the first shape may be a collection of coordinate values of surface positions of the paste.

Further, the control part 22 calculates, from the second oblique-view image, the second shape which is the three-dimensional shape of the mounted body 106 obtained by bonding the chip component 104 (S52). The second shape preferably includes at least the diameter d2, the die height h2, and the fillet height h3. Further, the second shape may be a collection of coordinate values of surface positions of the mounted body 106.

Next, the control part 22 calculates a paste error E1 which is an error between the calculated first shape and a first target shape stored in the memory 50 (S54). Here, the first target shape is an ideal shape of the application body 102. This first target shape may be set in advance by a user. Further, a shape obtained by modifying an initial shape set by the user on the device side may be used as the first target shape due to fluctuations in various conditions (for example, fluctuations in the viscosity of the paste, and the like).

Further, if the paste error E1 represents the degree of difference between the first target shape and the first shape (measured shape), the calculation method of the paste error E1 is not particularly limited. Therefore, the paste error E1 may be a deviation of a typical size value representing the shape of the paste (for example, the paste height h1, the paste diameter d1, and the like). Further, when the first target shape and the first shape are a collection of coordinate values of surface positions of the paste, the paste error E1 may be a mean square deviation or a standard deviation of Z coordinate values, or the like.

If the paste error E1 can be calculated, subsequently, the control part 22 calculates a final error Ef which is an error between the calculated second shape and a second target shape stored in the memory 50 (S56). Here, the second target shape is an ideal shape of the mounted body 106. This second target shape is set in advance by a user according to product specifications that are required. Further, if the final error Ef represents the degree of difference between the second target shape and the second shape (measured shape), the calculation method of the final error Ef is not particularly limited. Therefore, the final error Ef may be a deviation of a typical size value representing the shape of the mounted body 106 (for example, the die height h2, the mounting diameter d2, and the like). Further, when the second target shape and the second shape are a collection of coordinate values of surface positions of the mounted body 106, a mounting error E2 may be a mean square deviation or a standard deviation of Z coordinate values, or the like.

Next, the control part 22 compares the calculated paste error E1 with an allowable paste error Edef1 stored in the memory 50 (S58). The allowable paste error Edef1 is an allowable value of the paste error E1, and is an error value to an extent that the quality of the mounted body 106 cannot be maintained. The allowable paste error Edef1 may be a fixed value set in advance by a user, or may be a variable value that changes according to fluctuations in various conditions (for example, fluctuations in the viscosity of the paste). As a result of comparison, when the paste error E1 exceeds the allowable paste error Edef1 (Yes in S58), it is judged that the application processing is defective (S60).

Subsequently, the control part 22 corrects the calculated final error Ef by the paste error E1 to obtain the mounting error E2 (S62). That is, the calculated final error Ef includes an error amount e1 caused by an application defect and an error amount e2 caused by a mounting defect. Therefore, the mounting processing cannot be evaluated accurately with the final error Ef. Thus, in this example, the final error Ef is corrected by the paste error E1 to calculate the mounting error E2.

Various methods for this correction are considered, but it is desirable that the larger the paste error E1 is, the smaller the mounting error E2 is. Therefore, the mounting error E2 may be, for example, a value obtained by multiplying the final error Ef by a coefficient K=f(E1) whose absolute value decreases as the paste error E1 increases (E2=Ef*K).

In any case, if the mounting error E2 is obtained, the control part 22 compares the mounting error E2 with an allowable mounting error Edef2 (S64). The allowable mounting error Edef2 is set in advance by a user according to product specifications that are required. Then, as a result of comparison, when the mounting error E2 exceeds the allowable mounting error Edef2 (Yes in S64), it is judged that the mounting processing is defective (S66).

As is clear from the above explanation, according to this example, the paste error E1 which is an evaluation index of the application processing is obtained based on the first shape, and the mounting error E2 which is an evaluation index of the mounting processing is obtained based on the second shape and the paste error E1 (the evaluation result of the application processing). Therefore, the application processing and the mounting processing can be evaluated separately. Then, thereby, it is possible to determine whether the mounting defect is caused by the application processing or the mounting processing, and it becomes easy to take measures for reducing mounting defects.

Figure 8:
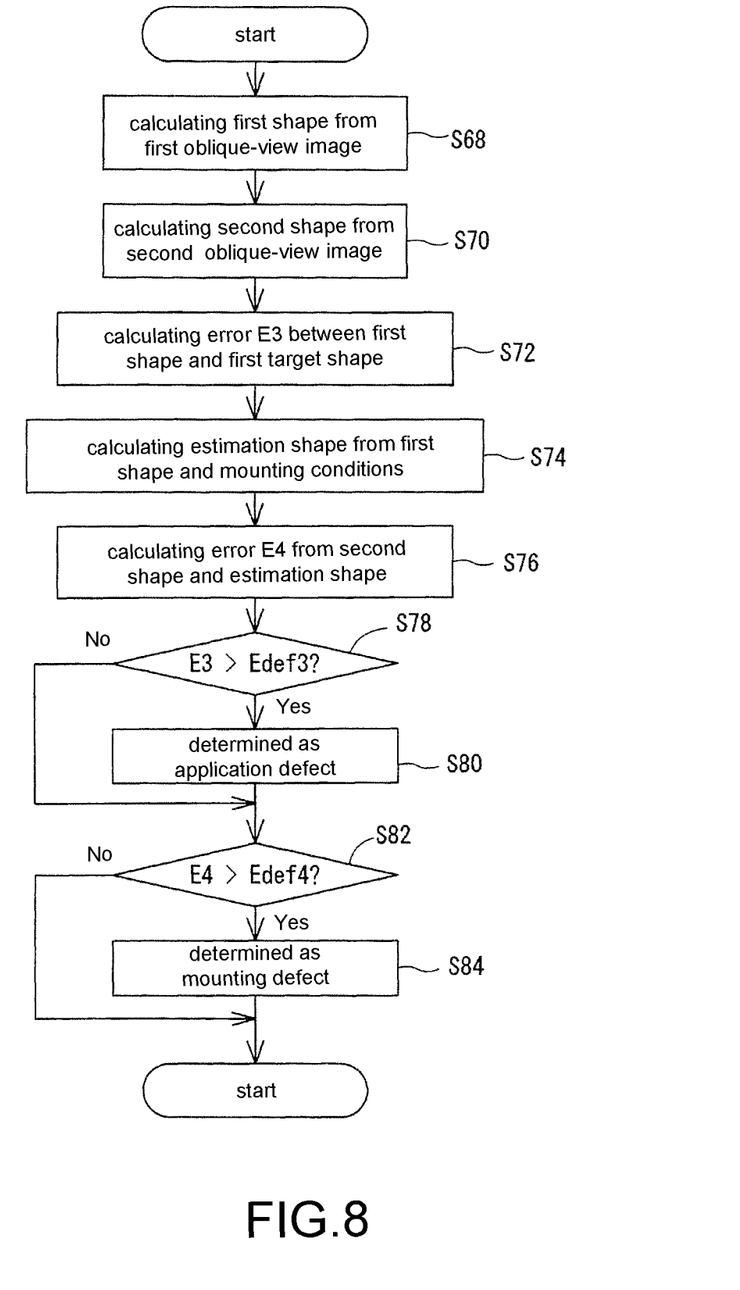
FIG. 8 is a flowchart showing another example of the flow of evaluation of each processing

Further, as another form, the three-dimensional shape of the mounted body 106 obtained by the mounting processing may be estimated as an estimation shape based on the first shape and the mounting conditions, and the mounting processing may be evaluated based on the comparison between the estimation shape and the second shape. FIG. 8 is a flowchart showing the flow of evaluation processing in this case. In the flow of FIG. 8, the control part 22 first respectively calculates the first shape (the measured shape of the application body 102) from the first oblique-view image and calculates the second shape (the measured shape of the mounted body 106) from the second plan-view image (S68, S70). Further, the control part 22 obtains a paste error E3 which is an error between the calculated first shape (the measured shape of the application body 102) and the first target shape (the target shape of the application body 102) (S72). Up to here, it is almost the same as the flow in FIG. 7.

Next, based on the calculated first shape and the mounting conditions, the control part 22 estimates the three-dimensional shape of the mounted body 106 obtained by the mounting processing as the estimation shape (S74). Here, the mounting conditions include, for example, a dropping height, a pressing force, a heating temperature, and the like of the bonding head 30. Further, as for the estimation of the estimation shape, the correlation between the deformation amount of the application body 102 (paste) due to bonding and bonding conditions may be acquired in advance by an experiment or the like, and the shapes of the application body 102 and the chip component 104 after bonding may be estimated based on the correlation. Further, a simulation device which performs finite element analysis or the like may be built in the control part 22, and the estimation shape may be obtained using the simulation device.

If the estimation shape is obtained, the control part 22 obtains a mounting error E4 which is an error between the second shape (the measured shape of the mounted body 106) and the estimation shape (the estimation shape of the mounted body 106) (S76). That is, the estimation shape is a shape estimated in consideration of the first shape which is the measured shape of the application body 102. If the mounting processing is performed according to theory, the second shape is expected to be as the estimation shape. If there is a large difference between the estimation shape and the second shape, it can be said that the mounting processing is not performed according to theory and some mounting defects has occurred. Therefore, the mounting error E4 can be used as an evaluation index for the mounting processing.

If the paste error E3 and the mounting error E4 are obtained, the control part 22 compares the paste error E3 and the mounting error E4 with allowable errors Edef3 and Edef4 stored in the memory 50 (S78, S82). As a result of comparison, if the paste error E3 exceeds the allowable paste error Edef3, it is judged that an application defect has occurred (S80), and if the mounting error E4 exceeds the allowable mounting error Edef4, it is judged that a mounting defect has occurred (S84).

As described above, according to this example, the target shape of the mounted body 106 is estimated as the estimation shape based on the first shape and the bonding conditions. Here, because the estimation shape is a shape that reflects an actual shape of the application body 102, it is possible to more accurately determine the mounting defect by comparing the estimation shape with the second shape.

Based on the evaluation result obtained in this way, the control part 22 may perform a feedback control or a feedforward control on the application processing and the mounting processing. For example, the control part 22 may feedback the evaluation index of the application processing to application processing control, or may feedback the evaluation index of the mounting processing to at least one of application processing control and mounting processing control. For example, if the paste errors E1 and E3 are obtained, the control part 22 may adjust an application parameter (for example, a discharge pressure, a discharge height, and the like of the dispenser 24) which is a control parameter involved in the application processing so that the paste errors E1 and E3 can be reduced. Similarly, if the mounting errors E2 and E4 are obtained, the control part may adjust at least one of the application parameter and a bonding parameter (a dropping height, a pressing pressure, a heating temperature, and the like) which is a control parameter involved in the mounting processing so that the mounting errors E2 and E4 can be reduced.

Further, in FIG. 6, after the application processing and the mounting processing are completed, the evaluations of the application processing and the mounting processing are performed (step S44), but at a stage where the first oblique-view image is acquired (between steps S26 and S30), the paste errors E1 and E3 may be obtained. Then, in order that a final mounting defect can be reduced, a feedforward control for modifying the bonding parameter may be performed based on the paste errors E1 and E3. For example, in a product where the die height h2 is considered to be important, when the paste height h1 becomes higher than a target value, the dropping height of the bonding head 30 may be modified to be lower than normal, and the die height h2 may be brought close to the target value.

Figure 9:
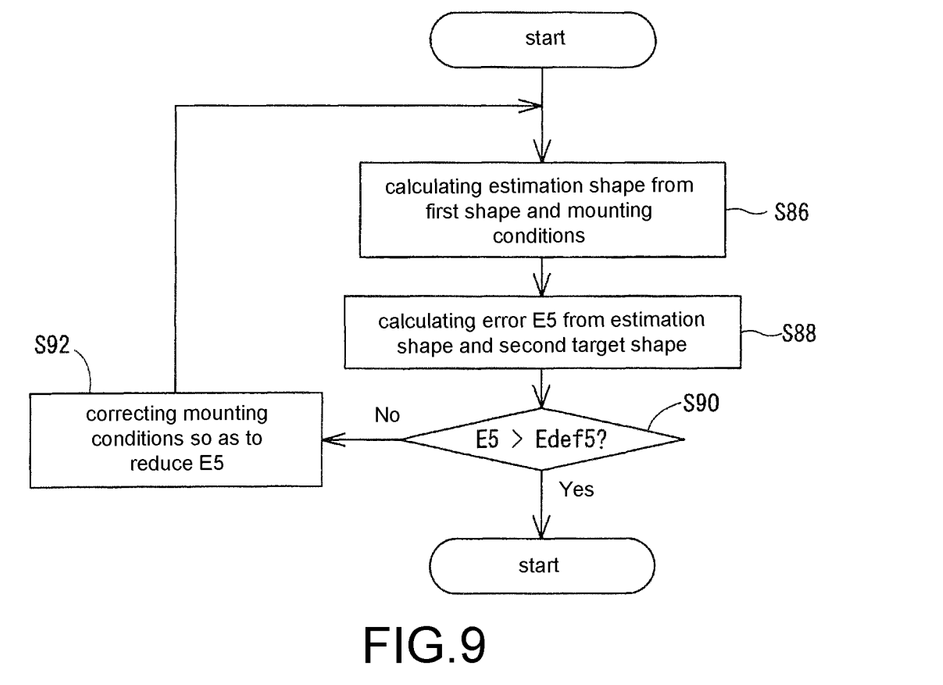
FIG. 9 is a flowchart showing the flow of modification of bonding conditions.

FIG. 9 is a diagram showing an example of this modification flow of the bonding parameter. In the example of FIG. 9, after the first oblique-view image is acquired, an estimation shape is obtained based on the first shape and the bonding condition (including the bonding parameter) (S86). Subsequently, a predicted error E5 which is an error between the estimation shape and the second shape which is the target shape of the mounted body 106 is calculated (S88). The control part 22 compares the predicted error E5 with an allowable mounting error Edef5 set in advance (S90). As a result of comparison, when the predicted error E5 exceeds the allowable mounting error Edef5, the control part 22 modifies the bonding condition (specifically, the bonding parameter) so as to reduce the predicted error E5 (S92). Then, the process returns to step S86 again, and the estimation shape is calculated based on the modified bonding condition and the first shape. Then, steps S88 and S90 are performed based on the estimation shape. After that, the same procedure is repeated until the predicted error E5 is less than the allowable mounting error Edef5. Then, if the flow of FIG. 9 is completed, the mounting processing may be executed under the bonding condition obtained finally.

Meanwhile, it is generally known that the physical property of a paste such as viscosity and the like changes depending on elapsed time or ambient environment. For example, it is known that the viscosity of the paste gradually increases with the passage of time. Further, the viscosity of the paste also changes depending on ambient temperature and the like. If the physical property of the paste fluctuates, appropriate values of the application parameter and the bonding parameter also fluctuate.

Thus, the physical property of the paste may be estimated, and the application parameter or the bonding parameter may be changed according to the estimation result. Further, the estimation shape or the first target shape used when each processing is evaluated may be changed according to the estimated physical property of the paste. That is, even if the first shape and the bonding condition are the same, if the physical property of the paste changes, the shape of the mounted body 106 obtained after bonding also changes. Thus, the estimation shape may be calculated in consideration of not only the first shape and the bonding condition, but also the physical property of the paste. Further, if the physical property of the paste changes, the paste shape (the first target shape) required to obtain a target mounting shape also changes. Thus, the first target shape which is the target shape of the paste may be changed according to the change in the physical property of the paste.

Figure 10:
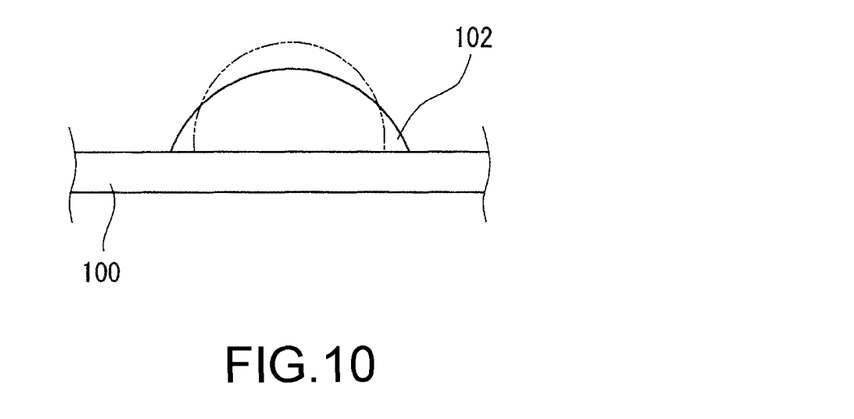
FIG. 10 is an image diagram showing a difference in the shape of an application body due to viscosity.

Various methods for estimating the physical property of the paste are considered, for example, the physical property of the paste may be estimated based on the size ratio of one application body 102. That is, as shown by a solid line in FIG. 10, the application body 102 formed by applying the paste on the substrate 100 swells into a dome shape due to surface tension. If the viscosity of the paste increases, the horizontal spread of the paste decreases and the height increases as shown by a two-dot chain line in FIG. 10. That is, along with the increase of the viscosity of the paste, a ratio h1/d1 of the height h1 with respect to the paste diameter d1 increases. Thus, if the first shape is obtained, the control part 22 may obtain the ratio h1/d1 of the height with respect to the diameter, and estimate the viscosity of the paste based on the value of the ratio h1/d1. Then, based on the estimated viscosity of the paste, the application parameter or the bonding parameter of the paste may be modified.

Further, as another form, the physical property of the paste may be estimated based on the fluctuation amount in the sizes between a plurality of applied application bodies 102 and the fluctuation amount in the application conditions of a plurality of application bodies 102. For example, it is expected that the viscosity of the paste changes over time when the same syringe is used. Then, even under the same application condition, it is assumed that the paste height h1 changes, for example, if the viscosity of the paste increases. Therefore, the height h1 of the plurality of applied application bodies 102 may be acquired, and the physical property of the paste may be obtained from the fluctuation amount of the height h1.

Figure 11:
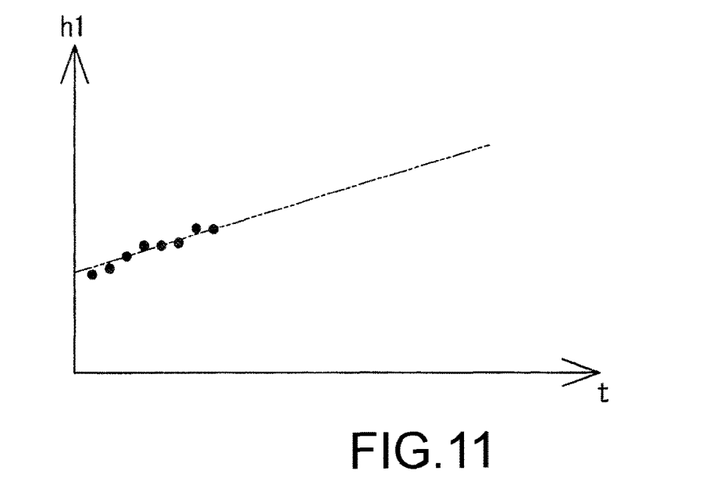
FIG. 11 is a diagram showing an example of a measurement result of paste height.

This is described with reference to FIG. 11. FIG. 11 is a diagram showing an example of the relationship between elapsed time t and the paste height h1 from the start of use of the syringe (not shown). In FIG. 11, the horizontal axis shows the elapsed time t, and the vertical axis shows the paste height h1. Further, in FIG. 11, black circles show the measurement results of the paste height h1. When the measurement result is obtained, the control part 22 may obtain a correlation between the paste height h1 and the elapsed time t from the measurement result, and may acquire the correlation as information showing the physical property of the paste. In the case of the example of FIG. 11, an approximate straight line (two-dot chain line) of a plurality of measurement results (black circles) may be acquired as physical property information of the paste. Then, based on the obtained approximate straight line, the physical property of the paste in the future and the control parameter value suitable for the physical property may be estimated and adjusted. In addition, although the elapsed time t has been described as the time from the start of use of the syringe, the elapsed time t may be elapsed time from the application of the application body 102 to the measurement of the shape of the application body 102. In this case, it is predicted that the paste is exposed to air over the elapsed time t and the viscosity changes as shown in FIG. 11.

Further, it is expected that if the viscosity of the paste in the syringe increases, a discharge pressure required to discharge the paste having the same volume from the syringe increases. Therefore, the physical property of the paste may be estimated based on the fluctuation amount of the application conditions (the discharge pressure and the like) instead of the size of the application body 102. In any case, the chip component 104 can be mounted more appropriately by estimating the physical property of the paste and modifying various control parameters according to the physical property. Further, by modifying the first target shape and the estimation shape according to the estimated physical property, the application processing and the mounting processing can be evaluated more accurately.

Meanwhile, in this example, the three-dimensional shapes of the application body 102 and the mounted body 106 are calculated based on oblique-view images. However, depending on the configuration of the imagers 38 and 42, there is a case in which the entire shape of an object cannot be accurately grasped only from oblique-view images. This is described with reference to FIG. 12.

Figure 12:
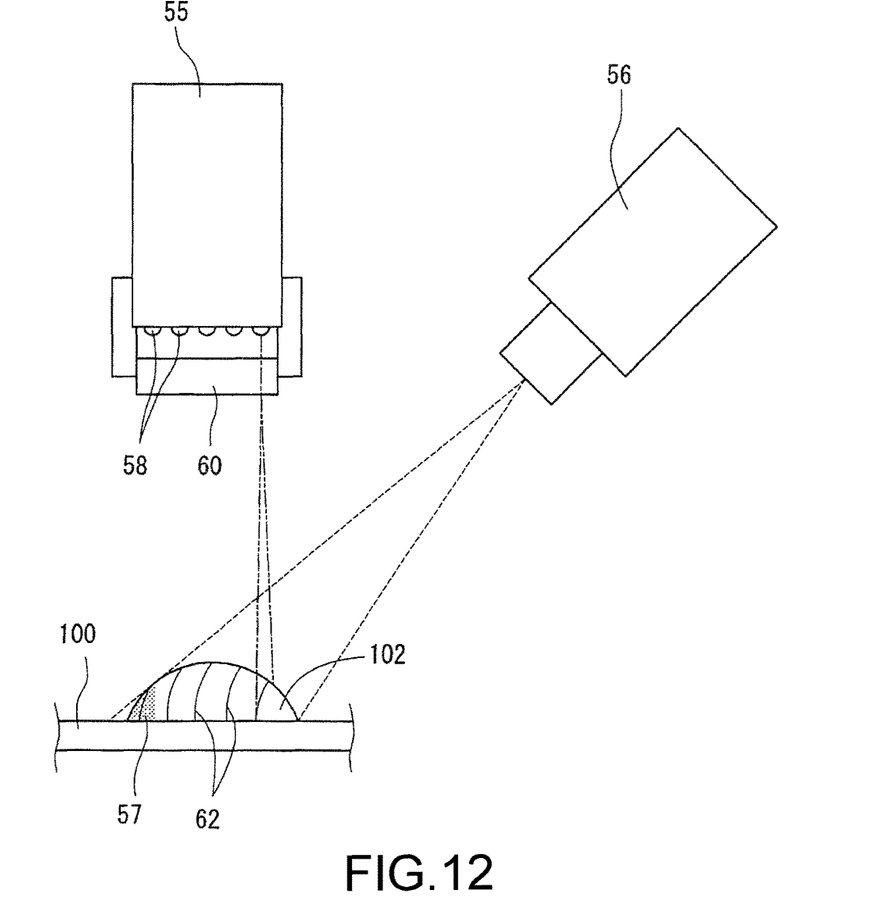
FIG. 12 is a schematic diagram showing the configuration of a 3D imager using an optical cutting method.
Figure 13:
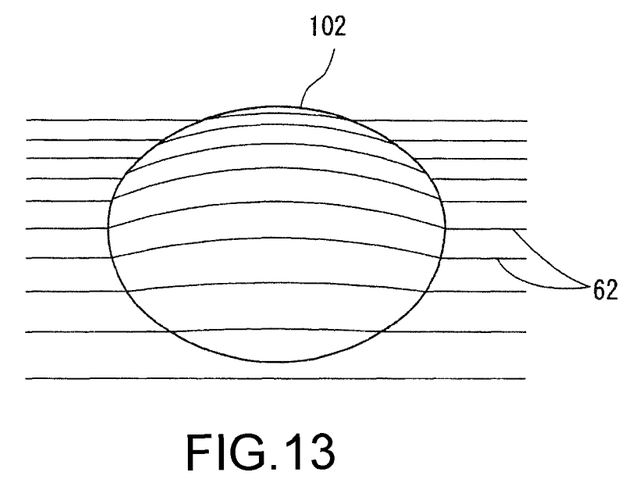
FIG. 13 is an image diagram of obtained 3D images.

FIG. 12 is a schematic diagram showing the configuration of an imager that acquires three-dimensional information including height by an optical cutting method. The imager has a projector 55 and a camera 56 that is arranged at an angle with respect to the projector 55. The projector 55 has a plurality of light sources 58, and an optical member 60 that expands light from the light source 58 in one direction and converts the light into a linear light 62. Therefore, a plurality of linear lights 62 are emitted from the projector 55. The camera 56 images an object and has an image sensor such as CMOS or CCD. FIG. 13 is an image diagram of an image obtained by imaging the application body 102 as an object. As shown in FIG. 13, the plurality of linear lights 62 appear to be appropriately distorted according to the surface shape of the object. By calculating the height of the object from the shape of the linear lights 62, the three-dimensional shape of the object can be calculated.

According to the optical cutting method, the three-dimensional shape of the object can be calculated with relatively inexpensive equipment. On the other hand, in the optical cutting method, because the object is imaged only from an oblique direction, there is a range which becomes a shadow of the object itself and cannot be imaged. Specifically, in FIG. 12, when viewed from the camera 56, a hatched location becomes a shadow of the object and thus becomes a missing location 57 that cannot be imaged. As a result, the three-dimensional shape of the missing location 57 cannot be grasped only by oblique-view images captured by the imager.

Thus, in this case, the shape of the missing location 57 may be estimated by a plan-view image. For example, because the application body 102 has symmetry in many cases, the center point of the application body 102 may be obtained from a plan-view image, and the three-dimensional shape of the hatch location may be estimated based on a three-dimensional shape of a location symmetrical with the missing location 57.

In this way, by estimating the three-dimensional shape of the location missing in the oblique-view image based on the plan-view image, it is possible to calculate the three-dimensional shape of the entire object by using inexpensive equipment. In addition, as an imager in which the missing location 57 is generated, the imager using the optical cutting method is given as an example, but obviously the above technique may be used for an imager of another form.

Further, regardless of the configuration of the imager, it may require a large amount of calculations and take time to calculate the three-dimensional shape from the oblique-view image or the like. Thus, a correlation between the three-dimensional shape and the two-dimensional shape may be estimated from 3D images and the 2D images obtained for a part of objects among a plurality of objects (the application bodies 102 or the mounted bodies 106). Then, the three-dimensional shape of another object may be estimated based on the correlation and the 2D image obtained for this object.

Figure 14:
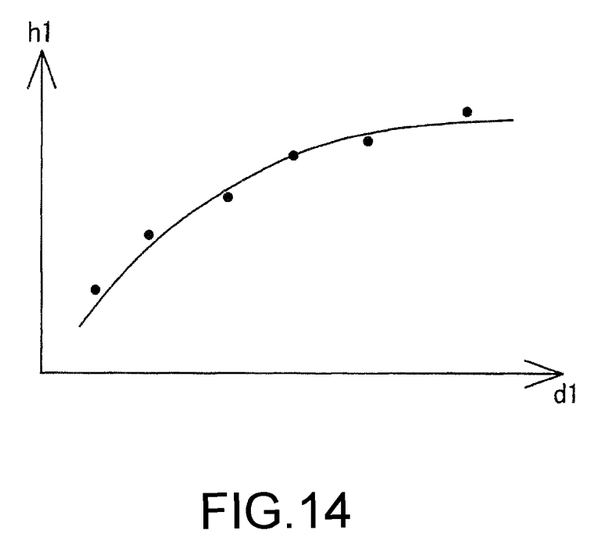
FIG. 14 is a diagram showing an example of a measurement result of the application body.

For example, the height h1 of the application body 102 formed by applying the paste on the substrate 100 becomes higher easily as the diameter d1 of the application body 102 increases. Thus, oblique-view images are acquired only for a part of the application bodies 102 among the plurality pastes, and the correlation between the diameter d1 and the height h1 is acquired based on measurement result. FIG. 14 is a diagram showing an example of the correlation, in which the horizontal axis shows the paste diameter d1, the vertical axis shows the paste height h1, and black circles show the measured values. Approximating the measured values gives a correlation curve as shown by a solid line. The control part 22 may calculate the paste diameter d1 from the plan-view image of the application body 102 captured only from the vertical direction instead of being captured from an oblique direction, and compare the paste diameter d1 with the correlation curve, and thereby estimate the paste height h1. Then, with this configuration, the handling amount of the oblique-view image can be significantly reduced, and the time required for calculation can be shortened. As a result, the time required for the mounting processing and the evaluation thereof can be shortened.

In addition, the configuration described above is an example and other configurations may be changed as appropriate, as long as this configuration has the imagers 38 and 42 for acquiring the first and second oblique-view images, calculates the first shape and the second shape from the first and second oblique-view images, and at least individually evaluates the application processing and the mounting processing based on the first and second shapes. For example, in this example, die bonding apparatus has been described as an example of the mounting apparatus, but other types of mounting apparatus such as a flip-chip bonder device may be used as long as this mounting apparatus fixes a chip component via a paste.

What is claimed is:

1. A mounting apparatus, for mounting a chip component on a substrate via a paste, comprising:
    a paste application part that applies the paste on the substrate under predetermined application conditions to form an application body;
    a bonding part that forms a mounted body obtained by mounting the chip component on the substrate under predetermined mounting conditions via the application body;
    a first imaging part that images the application body after application processing of the paste and before mounting processing of the chip component to acquire first image information;
    a second imaging part that images the mounted body after the mounting processing to acquire second image information; and
    a control part that controls the paste application part, the bonding part, and the first and second imaging part, and obtains a three-dimensional shape of the application body from the first image information as a first shape and calculates a three-dimensional shape of the mounted body from the second image information as a second shape,
    wherein the control part obtains a paste error which is a result of comparison between the first shape and a first target shape that is a target shape of the application body and a final error which is a result of comparison between the second shape and a second target shape that is a target shape of the mounted body, and evaluates the mounting processing by a mounting error that is obtained by modifying the final error based on the paste error.

2. The mounting apparatus according to claim 1, wherein the control part evaluates the application processing based on at least the first shape, and evaluates the mounting processing based on at least an evaluation result of the application processing and the second shape.

3. The mounting apparatus according to claim 1, wherein the control part estimates the three-dimensional shape of the mounted body as an estimation shape based on at least the first shape and the mounting conditions, evaluates the application processing based on at least the first shape, and evaluates the mounting processing based on at least the estimation shape and the second shape.

4. The mounting apparatus according to claim 3, wherein the control part acquires physical property information of the paste based on a size of the application body, or a fluctuation amount caused by changes in sizes over time between a plurality of application bodies when applying the plurality of application bodies.

5. The mounting apparatus according to claim 4, wherein the control part estimates the estimation shape based on at least the first shape, the mounting conditions, and the physical property information.

6. The mounting apparatus according to claim 4, wherein the control part evaluates the application processing based on the result of comparison between the first target shape which is the target shape of the application body and the first shape, and modifies the first target shape based on the physical property information.

7. The mounting apparatus according to claim 1, wherein the control part changes the application conditions based on the evaluation result of the application processing, and changes the application conditions or the mounting conditions based on the evaluation result of the mounting processing.

8. The mounting apparatus according to claim 1, wherein the control part changes the mounting conditions based on the evaluation result of the application processing.

9. The mounting apparatus according to claim 1, further comprising:
    a first plane imaging part that images the application body from a vertical direction after the application processing and before the mounting processing to acquire a first plan-view image of the application body; and
    a second plane imaging part that images the mounted body from a vertical direction after the mounting processing to acquire a second plan-view image of the mounted body;
    wherein the first imaging part images the application body from an oblique direction to acquire a first oblique-view image of the application body,
    the second imaging part images the mounted body from an oblique direction to acquire a second oblique-view image of the mounted body, and
    the control part estimates a shadow shape of the first oblique-view image from the first plane image, and estimates a shadow shape of the second oblique-view image from the second plane image.

10. The mounting apparatus according to claim 1, further comprising:
    a first plane imaging part that images the application body from a vertical direction after the application processing and before the mounting processing to acquire a first plan-view image of the application body; and a second plane imaging part that images the mounted body from a vertical direction after the mounting processing to acquire a second plan-view image of the mounted body;

wherein the first imaging part images the application body from an oblique direction to acquire a first oblique-view image of the application body, the second imaging part images the mounted body from an oblique direction to acquire a second oblique-view image of the mounted body, and the control part calculates a first correlation between the first plan-view image and the first oblique-view image and estimates the three-dimensional shape of the application body based on the first correlation, and calculates a second correlation between the second plan-view image and the second oblique-view image and estimates the three-dimensional shape of the mounted body based on the second correlation.

11. The mounting apparatus according to claim 1, wherein the control part acquires physical property information of the paste based on a size of the application body, or a fluctuation amount caused by changes in sizes over time between a plurality of application bodies when applying the plurality of application bodies.

12. The mounting apparatus according to claim 2, wherein the control part acquires physical property information of the paste based on a size of the application body, or a fluctuation amount caused by changes in sizes over time between a plurality of application bodies when applying the plurality of application bodies.

13. The mounting apparatus according to claim 5, wherein the control part evaluates the application processing based on the result of comparison between the first target shape which is the target shape of the application body and the first shape, and modifies the first target shape based on the physical property information.

14. The mounting apparatus according to claim 2, wherein the control part changes the application conditions based on the evaluation result of the application processing, and changes the application conditions or the mounting conditions based on the evaluation result of the mounting processing.

15. The mounting apparatus according to claim 2, wherein the control part changes the mounting conditions based on the evaluation result of the application processing.

16. The mounting apparatus according to claim 2, further comprising:

a first plane imaging part that images the application body from a vertical direction after the application processing and before the mounting processing to acquire a first plan-view image of the application body; and a second plane imaging part that images the mounted body from a vertical direction after the mounting processing to acquire a second plan-view image of the mounted body;

wherein the first imaging part images the application body from an oblique direction to acquire a first oblique-view image of the application body, the second imaging part images the mounted body from an oblique direction to acquire a second oblique-view image of the mounted body, and the control part estimates a shadow shape of the first oblique-view image from the first plane image, and estimates a shadow shape of the second oblique-view image from the second plane image.

17. The mounting apparatus according to claim 2, further comprising:

a first plane imaging part that images the application body from a vertical direction after the application processing and before the mounting processing to acquire a first plan-view image of the application body; and a second plane imaging part that images the mounted body from a vertical direction after the mounting processing to acquire a second plan-view image of the mounted body;

wherein the first imaging part images the application body from an oblique direction to acquire a first oblique-view image of the application body, the second imaging part images the mounted body from an oblique direction to acquire a second oblique-view image of the mounted body, and the control part calculates a first correlation between the first plan-view image and the first oblique-view image and estimates the three-dimensional shape of the application body based on the first correlation, and calculates a second correlation between the second plan-view image and the second oblique-view image and estimates the three-dimensional shape of the mounted body based on the second correlation.

* * * * *